United States Patent

Chou et al.

(10) Patent No.: US 8,710,936 B2
(45) Date of Patent: Apr. 29, 2014

(54) RESONANT OSCILLATOR WITH START UP AND SHUT DOWN CIRCUITRY

(75) Inventors: Catherine S. Chou, Cupertino, CA (US); William C. Athas, San Jose, CA (US); Heather R. Sullens, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 216 days.

(21) Appl. No.: 13/314,825

(22) Filed: Dec. 8, 2011

(65) Prior Publication Data

US 2012/0105162 A1    May 3, 2012

Related U.S. Application Data

(63) Continuation-in-part of application No. 12/535,974, filed on Aug. 5, 2009, now Pat. No. 8,320,141.

(51) Int. Cl.
*H03B 5/12* (2006.01)

(52) U.S. Cl.
USPC .................................. 331/117 FE; 331/185

(58) Field of Classification Search
USPC ............................................ 331/117 FE, 185
See application file for complete search history.

(56) References Cited

U.S. PATENT DOCUMENTS

| | | | |
|---|---|---|---|
| 5,051,881 A | 9/1991 | Herold |
| 5,396,195 A | 3/1995 | Gabara |
| 5,559,478 A | 9/1996 | Athas |
| 5,677,077 A | 10/1997 | Faulk |
| 5,684,682 A | 11/1997 | Zhong |
| 5,760,637 A | 6/1998 | Wong |
| 6,064,277 A | 5/2000 | Gilbert |
| 6,169,673 B1 | 1/2001 | McIntyre |
| 6,188,590 B1 | 2/2001 | Chang |
| 6,249,192 B1 | 6/2001 | Gabara |
| 6,559,689 B1 | 5/2003 | Clark |

(Continued)

FOREIGN PATENT DOCUMENTS

| GB | 2374952 A | 10/2002 |
|---|---|---|
| JP | 2003218634 A | 7/2003 |

(Continued)

OTHER PUBLICATIONS

Athas, W.C. et al., "A Resonant Signal Driver for Two-Phase, Almost-Non-Overlapping Clocks", pp. 129-132, 1996.

(Continued)

*Primary Examiner* — Joseph Chang
(74) *Attorney, Agent, or Firm* — Park, Vaughan, Fleming & Dowler LLP

(57) ABSTRACT

A system which starts up and shuts down a resonant oscillator circuit. During start up, the system operates a driving circuit, which is external to the resonant oscillator circuit, wherein the driving circuit uses a first clock signal to control a first phase output of the resonant oscillator circuit. At the same time, the driving circuit uses a second clock signal to control a second phase output of the resonant oscillator circuit, wherein the first and second clock signals have opposite phases. While the first and second phase outputs are being controlled, the system ramps up an input voltage, which is used to power the resonant oscillator circuit, wherein the ramping takes place across multiple initial oscillation periods. During shut down, the system shuts down the resonant oscillator circuit by ramping down the input voltage. Next, the system clamps the first and second phase outputs to a fixed voltage.

22 Claims, 4 Drawing Sheets

(56) References Cited

U.S. PATENT DOCUMENTS

| | | |
|---|---|---|
| 6,650,163 B1 | 11/2003 | Burns |
| 6,650,555 B2 | 11/2003 | Suzuki |
| 6,738,271 B2 | 5/2004 | Umeda |
| 2002/0041503 A1 | 4/2002 | Roohparvar |
| 2004/0196095 A1 | 10/2004 | Nonaka |
| 2006/0197583 A1 | 9/2006 | Yen |
| 2006/0290388 A1 | 12/2006 | Tolle |
| 2009/0167418 A1 | 7/2009 | Roghavan |
| 2011/0032043 A1 | 2/2011 | Athas |
| 2012/0306584 A1* | 12/2012 | Cao .................. 331/117 FE |

FOREIGN PATENT DOCUMENTS

| | | |
|---|---|---|
| WO | 02061930 A1 | 8/2002 |
| WO | 2006078244 A1 | 7/2006 |
| WO | 2009136369 A2 | 11/2009 |

OTHER PUBLICATIONS

Lenoir, Eric "Getting the Most out of Ceramic Capacitors", pp. 1-6, Aug. 1, 2003.

* cited by examiner

RESONANT OSCILLATOR WITH START UP AND SHUT DOWN CIRCUITRY

RELATED APPLICATIONS

This application is a continuation-in-part of pending U.S. patent application Ser. No. 12/535,974, entitled "High-Efficiency, Switched-Capacitor Power Conversion," filed on 5 Aug. 2009 by inventors William C. Athas and P. Jeffrey Ungar which is incorporated herein by reference.

BACKGROUND

1. Field

The disclosed embodiments generally relate to oscillator circuits. More specifically, the disclosed embodiments relate to a method and an apparatus for starting up a resonant oscillator circuit in a manner which mitigates overshooting problems and protects associated circuitry.

2. Related Art

Oscillator circuits are commonly used to generate clock signals in electrical systems. However, commonly used oscillator circuits can consume a significant amount of power, which is a disadvantage for systems that need to conserve power, such as portable computing devices. To solve this problem, "resonant oscillator circuits," which transfer energy back and forth between inductive and capacitive circuit elements, can be used to generate clock pulses without dissipating a significant amount of power. (For example, see U.S. Pat. No. 5,559,478, entitled "Highly Efficient, Complementary, Resonant Pulse Generation," by inventor William C. Athas, filed 17 Jul. 1995.)

Unfortunately, existing designs for resonant oscillator circuits are not well suited for certain applications. For example, in one application a resonant oscillator circuit is used to clock the two phases of a switched capacitor block (SCB) in a voltage conversion system. (See patent application Ser. No. 12/535,974, entitled "High-Efficiency Switched-Capacitor Power Conversion," filed on 5 Jul. 2009 by inventors William C. Athas and P. Jeffrey Ungar which is hereby incorporated herein by reference. In this application, if the clock signals are first turned on, so that power field-effect transistors (FETs) in the SCBs are at or near their minimum on-resistance and the capacitors of the SCBs are well below their normal operating voltage levels, the resulting inrush current can damage the FETs. Hence, it is desirable to first clock the SCBs with a low voltage swing, so that the power FETs in the SCBs have a high on-resistance, and then gradually decrease the on-resistance by increasing the amplitude of the clock signals.

Another problem is the uncontrolled and unpredictable way in which oscillations commence in a resonant oscillator during power up. As power is applied to the basic two-FET and two-inductor implementation disclosed in U.S. patent application Ser. No. 12/535,974 (cited above), current more or less equally divides between the two inductor branches. Asymmetries in the component values and the layout will eventually cause the two branch currents to become unequal which allows the oscillations to commence. However, the circuit may exist in a balanced, metastable state for an indeterminate period of time. Meanwhile, current builds up in each inductor in proportion to the duration of the metastable state. Consequently, when the circuit eventually exits the metastable state, the initial output pulses can be almost unbounded in magnitude, and may damage downstream components, such as the SCBs, or even the components of the resonant oscillator circuit itself.

Hence, what is needed is a resonant oscillator circuit, which does not suffer from the above-described problems.

SUMMARY

The disclosed embodiments provide a system which starts up a resonant oscillator circuit. During operation, this system operates a driving circuit, which is external to the resonant oscillator circuit, wherein the driving circuit uses a first clock signal to control a first phase output of the resonant oscillator circuit. At the same time, the driving circuit uses a second clock signal to control a second phase output of the resonant oscillator circuit, wherein the first and second clock signals have opposite phases. While the first and second phase outputs are being controlled, the system ramps up an input voltage, which is used to power the resonant oscillator circuit, wherein the ramping takes place across multiple initial oscillation periods.

In some embodiments, using the first and second clock signals to control the first and second phase outputs involves driving the first clock signal onto a first N-FET gate which clamps the output of the resonant oscillator circuit to a desired frequency, and driving the second clock signal onto a second N-FET gate which clamps the output of the resonant oscillator circuit to the desired frequency In some embodiments, the system discontinues the controlling of the first and second phase outputs after the multiple initial oscillation periods complete.

In some embodiments, the driving circuit includes a programmable microcontroller.

In some embodiments, ramping up the input voltage involves using an RC filter to ramp up the input voltage at a controlled rate.

In some embodiments, the system shuts down the resonant oscillator circuit by ramping down the input voltage. After the input voltage has been ramped down, the system clamps the first and second phase outputs to a fixed voltage.

In some embodiments, ramping down the input voltage involves disconnecting a power source from the input voltage, and draining charge from a capacitor having a first terminal coupled to the input voltage and a second terminal coupled to a base voltage, wherein draining the charge involves coupling the first terminal of the capacitor to the base voltage through a resistor.

In some embodiments, the resonant oscillator circuit is an LC oscillator circuit which includes at least two inductors and at least two capacitances.

In some embodiments, in addition to the first phase and second phase outputs, the resonant oscillator circuit includes a first inductor with a first terminal coupled to an input voltage and a second terminal coupled to the first phase output, and a second inductor with a first terminal coupled to the input voltage and a second terminal coupled to the second phase output. It also includes a first N-type transistor with a source terminal coupled to a base voltage, a drain terminal coupled to the first phase output, and a gate terminal coupled to the second phase output. It also includes a second N-type transistor with a source terminal coupled to the base voltage, a drain terminal coupled to the second phase output, and a gate terminal coupled to the first phase output.

In some embodiments, the resonant oscillator circuit additionally comprises a first capacitance and a second capacitance, which operate in concert with the first inductor and the second inductor to produce resonant oscillations, wherein the first capacitance includes capacitive components from a load on the first phase output and the gate terminal of the second N-type transistor, and the second capacitance includes

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a non-transitory computer-readable storage medium, which may be any device or medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Resonant Oscillator Circuit

Figure 1:
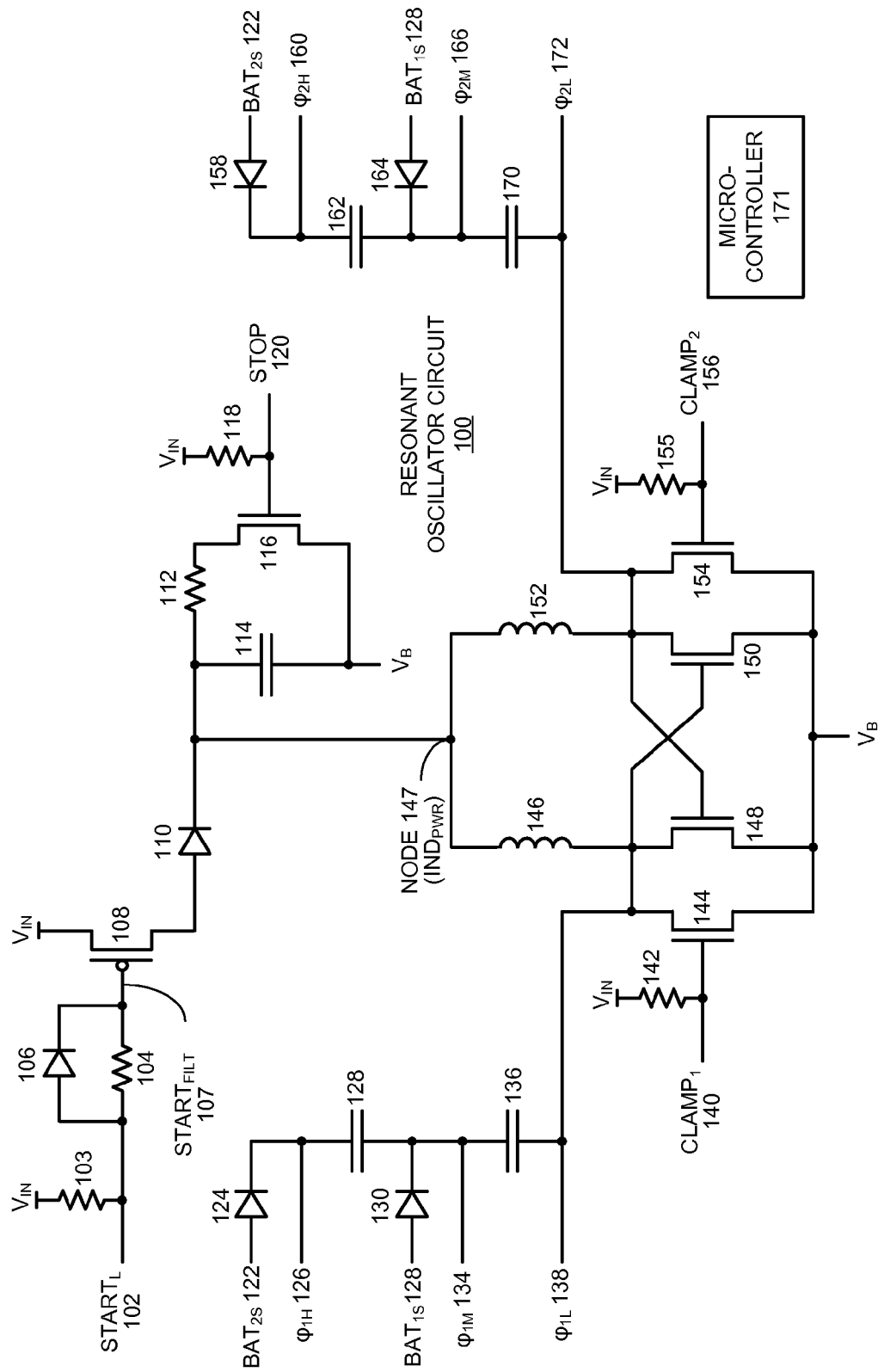
FIG. 1 illustrates a resonant oscillator circuit in accordance with the disclosed embodiments.

FIG. 1 illustrates a resonant oscillator circuit 100 in accordance with the disclosed embodiments. Referring to the bottom portion of FIG. 1, the core of the resonant oscillator circuit includes two complementary circuit sections that produce opposing clock phases. The first circuit section includes inductor 146 and field-effect transistor (FET) 148 and produces phase output $\phi_{1L}$ 138. The second complementary circuit section includes inductor 152 and FET 150 and produces phase output $\phi_{2L}$ 172, wherein phase outputs $\phi_{1L}$ 138 and $\phi_{2L}$ 172 provide opposite clock phases. Note that FETs 148 and 150 are cross-coupled so that the control input for each of FETs 148 and 150 is taken from the output from the complementary circuit section. Also note that the gate capacitance for each FET 148 and 150 is lumped in with the output-load capacitance for the opposing clock phase.

During operation of resonant oscillator circuit 100, energy oscillates back and forth between inductive and capacitive circuit elements without a significant conductive or switching loss. More specifically, in the first circuit section, energy oscillates between inductor 146 and the load capacitance for phase output $\phi_{1L}$ 138, which is lumped in with the gate capacitance for the opposing FET 150. Similarly, in the second circuit section, energy oscillates between inductor 152 and the load capacitance for phase output $\phi_{2L}$ 172, which is lumped in with the gate capacitance for the opposing FET 148.

The right-hand side of FIG. 1 illustrates circuitry that uses phase output $\phi_{2L}$ 172 to generate boosted phase outputs $\phi_{2M}$ 166 and $\phi_{2H}$ 160. These boosted phase outputs are useful for driving FETs which are sourced at higher voltages. The voltages on boosted phase outputs $\phi_{2M}$ 166 and $\phi_{2H}$ 160 track the voltage on phase output $\phi_{2L}$ 172, but are biased to be at higher voltage levels. This is accomplished by using two bootstrap capacitors 170 and 162, and two diodes 158 and 164. More specifically, diode 164 clamps phase output $\phi_{2M}$ 166 to $BAT_{1S}$ 128 during one phase and then follows phase output $\phi_{2L}$ 172 with a positive offset from $BAT_{1S}$ 128 during the other phase. Similarly, diode 158 clamps phase output $\phi_{2H}$ 160 to $BAT_{2S}$ 122 during one phase and then follows phase output $\phi_{2L}$ 172 with a positive offset from $BAT_{2S}$ 122 during the other phase. ($BAT_{1S}$ 128 and $BAT_{2S}$ 122 are voltages taken from a battery pack comprised of multiple battery cells coupled together in series. In particular, $BAT_{1S}$ 128 is a voltage across one bank of battery cells, whereas $BAT_{2S}$ 122 is a voltage across two banks of battery cells which are coupled together in series.) Similar circuitry on the left-hand side of FIG. 1 generates boosted phase outputs $\phi_{1M}$ 134 and $\phi_{1H}$ 126 from output $\phi_{1L}$ 138 by using bootstrap capacitors 136 and 128, and diodes 130 and 124.

The resonant oscillator illustrated in FIG. 1 also includes circuitry to clamp phase output signals $\phi_{1L}$ 138 and $\phi_{2L}$ 172. More specifically, the drain of FET 144 is coupled to phase output signal $\phi_{1L}$ 138 and the source of FET 144 is coupled to $V_B$. Moreover, $CLAMP_1$ signal 140 is coupled to the gate of FET 144 and is also coupled to $V_{IN}$ through resistor 142. When $CLAMP_1$ signal 140 is asserted, FET 144 causes phase output signal $\phi_{1L}$ 138 to be clamped to $V_B$. Similarly, the drain of FET 154 is coupled to phase output signal $\phi_{2L}$ 172 and the source of FET 154 is coupled to $V_B$. Also, $CLAMP_2$ signal 156 is coupled to the gate of FET 154 and is also coupled to $V_{IN}$ through resistor 155. When $CLAMP_2$ signal 156 is asserted, FET 154 causes phase output signal $\phi_{2L}$ 172 to be clamped to $V_B$. This clamping circuitry is also activated to initiate oscillations as is described in more detail below with reference to FIG. 2.

The resonant oscillator illustrated in FIG. 1 also includes circuitry to "ramp up" and "ramp down" a voltage $IND_{PWR}$ on node 147, which is applied to inductors 146 and 152. This circuitry includes P-type field-effect transistor (PFET) 108, which couples $V_{IN}$ to node 147 through diode 110. The gate of PFET 108 is coupled to $START_L$ signal 102 through resistor 104 and diode 106, and is also coupled to $V_{IN}$ through resistors 103 and 104, and diode 106. The circuitry also includes a capacitor 114 with a first terminal and a second terminal. The first terminal is coupled to node 147 and is also coupled through resistor 112 and FET 116 to $V_B$. The second terminal of capacitor 114 is coupled to $V_B$. The gate of FET 116 is coupled to STOP signal 120, and is also coupled to $V_{IN}$ through resistor 118.

The sequences of operations which take place during the start up and shut down processes are described in more detail below with reference to the timing diagrams which appear in FIG. 2. In one embodiment, control signals $START_L$ 102, STOP 120, $CLAMP_1$ 140 and $CLAMP_2$ 156 are all supplied by a programmable controller 171, which sequences the operations involved in the start up and shut down processes. Controller 171 can generally be any type of programmable computational engine, such as a device controller, a microcontroller, a service processor or any microprocessor-based controller.

Timing Diagram

Figure 2:
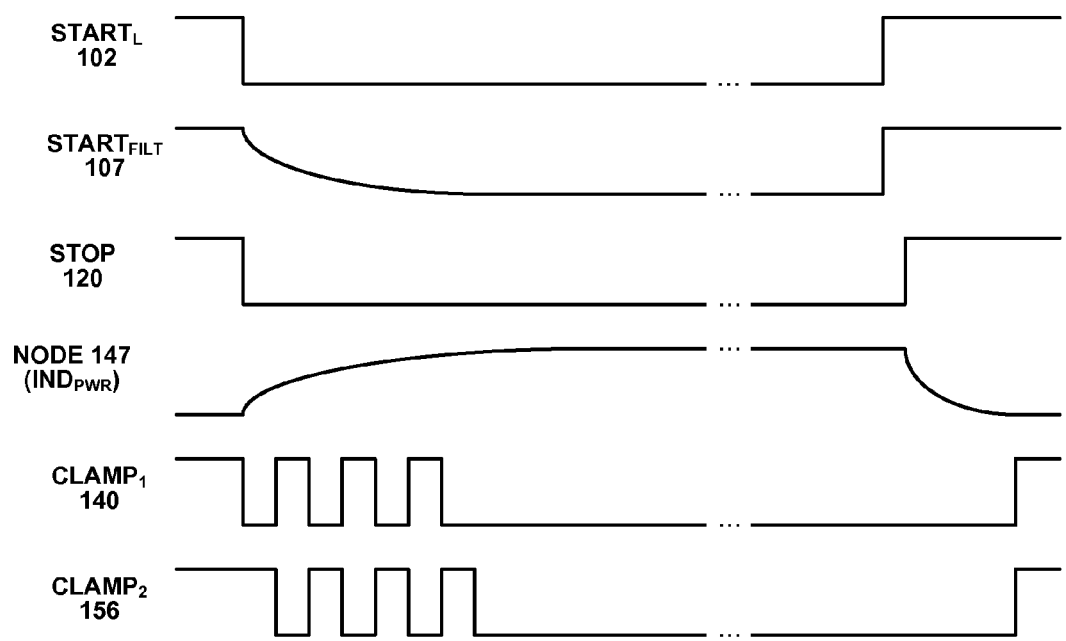
FIG. 2 presents a timing diagram illustrating signal levels during start up and shut down processes for the resonant oscillator circuit in accordance with the disclosed embodiments.

FIG. 2 presents a timing diagram illustrating signal levels during start up and shut down processes for resonant oscillator circuit 100 illustrated in FIG. 1 in accordance with the disclosed embodiments.

During the start up process, the system starts clocking the oscillator's clamp FETs 144 and 154 and then applies power to inductors 146 and 152 slowly by ramping up $IND_{PWR}$ on node 147. The inductors with their capacitive loads produce the oscillating phase outputs $\phi_{1L}$ 138 and $\phi_{2L}$ 172. Once the amplitude of phase outputs $\phi_{1L}$ 138 and $\phi_{2L}$ 172 becomes large enough, the clocking can stop.

Referring FIG. 2, during the start up process, controller 171 lowers STOP signal 120 which turns off FET 116 and releases node 147. (Otherwise, when STOP signal 120 is asserted, FET 116 ties node 147 to $V_B$.) At the same time, controller 171 applies clock signals to $CLAMP_1$ 140 and $CLAMP_2$ 156, wherein the clock signals are square waves having opposite phases and having a clock frequency that approximates the resonant frequency of the oscillator circuit 100. Then controller 171 lowers $START_L$ signal 102, which passes through an RC filter comprised of resistor 104 and the gate capacitance of PFET 108 to produce $START_{FILT}$ signal 107 which turns on PFET 108 and charges up capacitor 114. Note that this RC filter provides a slowly rising edge for voltage $IND_{PWR}$ on node 147, which slowly energizes inductors 146 and 152.

Once the amplitude of phase outputs $\phi_{1L}$ 138 and $\phi_{2L}$ 172 becomes large enough, the clock signals stop.

To shut down resonant oscillator circuit 100, controller 171 drives $START_L$ signal 102 high, which drives the gate of PFET 108 high through diode 106. This bypasses the RC time constant and immediately turns off PFET 108, which shuts off power to node 147. Controller 171 then sets STOP signal 120 high, which causes FET 116 to drain charge from capacitor 114 through resistor 112 to $V_B$. After a period of time, controller 171 raises $CLAMP_1$ signal 140 and $CLAMP_2$ signal 154 to $V_{IN}$.

Start Up Process

Figure 3:
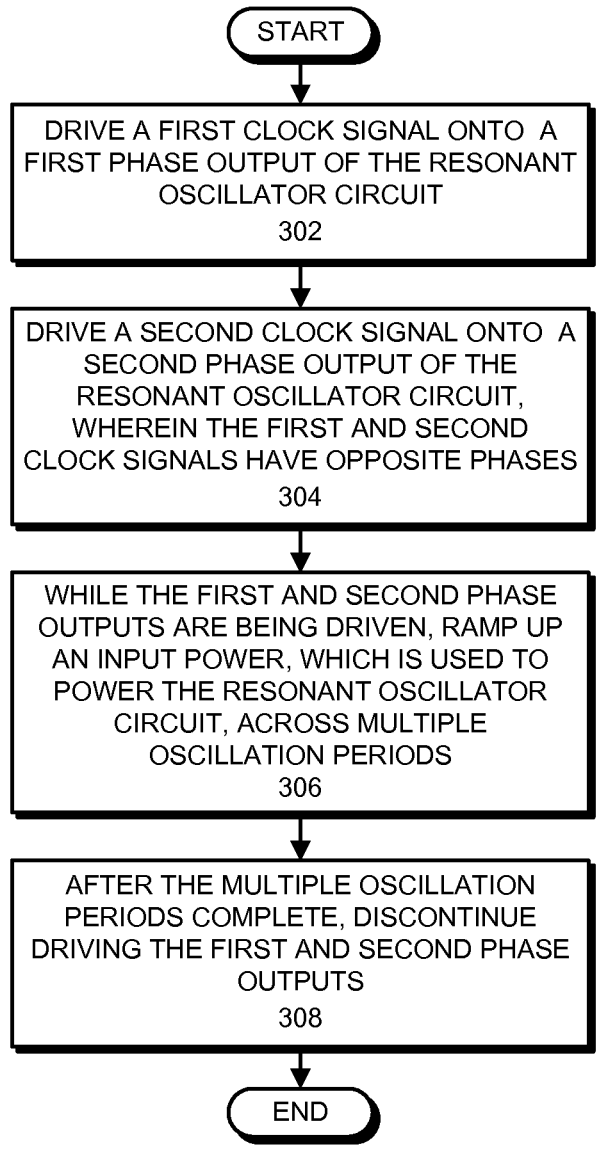
FIG. 3 presents a flow chart illustrating the start up process in accordance with the disclosed embodiments.

FIG. 3 presents a flow chart illustrating the start up process in accordance with the disclosed embodiments. During the start up process, the system uses a first clock signal to control a first phase output of the resonant oscillator circuit (step 302). At the same time, the system uses a second clock signal to control a second phase output of the resonant oscillator circuit, wherein the first and second clock signals have opposite phases (step 304). Note that using the first and second clock signals to control the first and second phase outputs can involve driving the first clock signal onto a first N-FET gate which clamps the output of the resonant oscillator circuit to a desired frequency, and driving the second clock signal onto a second N-FET gate which clamps the output of the resonant oscillator circuit to the desired frequency While the first and second phase outputs are being controlled, the system ramps up an input voltage, which is used to power the resonant oscillator circuit. This ramping process takes place across multiple initial oscillation periods (step 306). Finally, after the multiple oscillation periods complete, the system discontinues the controlling of the first and second phase outputs (step 308).

Shut Down Process

Figure 4:
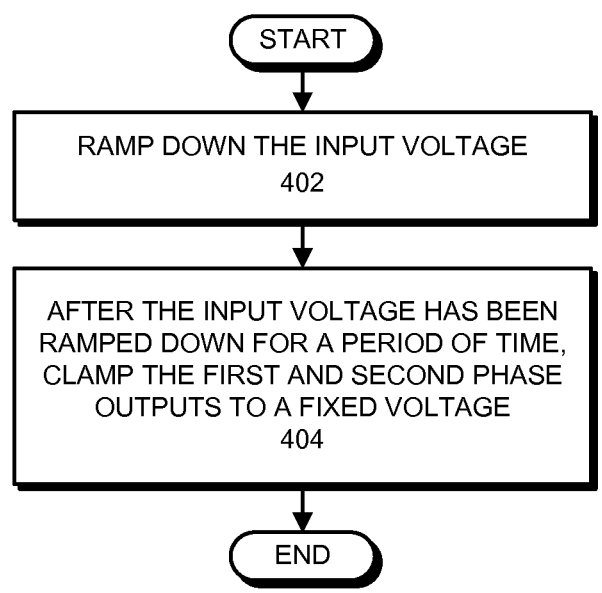
FIG. 4 presents a flow chart illustrating the shut down process in accordance with the disclosed embodiments.

FIG. 4 presents a flow chart illustrating the shut down process in accordance with the disclosed embodiments. During the shut down process, the system shuts down the resonant oscillator circuit by ramping down the input voltage (step 402). After the input voltage has been ramped down, the system clamps the first and second phase outputs to a fixed voltage (step 404).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for starting up a resonant oscillator circuit, the method comprising:
   operating a driving circuit, which is external to the resonant oscillator circuit, wherein the driving circuit uses a first clock signal to control a first phase output of the resonant oscillator circuit, and uses a second clock signal to control a second phase output of the resonant oscillator circuit, wherein the first and second clock signals have opposite phases;
   while the first and second phase outputs are being controlled, ramping up an input voltage, which is used to power the resonant oscillator circuit, wherein the ramping takes place across multiple initial oscillation periods; and
   discontinuing the controlling of the first and second phase outputs after the multiple initial oscillation periods complete.

2. The method of claim 1, wherein using the first and second clock signals to control the first and second phase outputs involves driving the first clock signal onto a first N-FET gate which clamps the output of the resonant oscillator circuit to a desired frequency, and driving the second clock signal onto a second N-FET gate which clamps the output of the resonant oscillator circuit to the desired frequency.

3. The method of claim 1, wherein the driving circuit includes a programmable microcontroller.

4. The method of claim 1, wherein ramping up the input voltage involves using an RC filter to ramp up the input voltage at a controlled rate.

5. The method of claim 1, further comprising shutting down the resonant oscillator circuit by:
   ramping down the input voltage; and
   after the input voltage has been ramped down, clamping the first and second phase outputs to a fixed voltage.

6. The method of claim 5, wherein ramping down the input voltage involves:
   disconnecting a power source from the input voltage; and
   draining charge from a capacitor having a first terminal coupled to the input voltage and a second terminal coupled to a base voltage, wherein draining the charge involves coupling the first terminal of the capacitor to the base voltage through a resistor.

7. The system of claim 1, wherein the resonant oscillator circuit is an LC oscillator circuit which includes at least two inductors and at least two capacitances.

8. The method of claim 7, wherein the resonant oscillator circuit comprises:
the first phase output;
the second phase output;
a first inductor with a first terminal coupled to an input voltage and a second terminal coupled to the first phase output;
a second inductor with a first terminal coupled to the input voltage and a second terminal coupled to the second phase output;
a first N-type transistor with a source terminal coupled to a base voltage, a drain terminal coupled to the first phase output, and a gate terminal coupled to the second phase output; and
a second N-type transistor with a source terminal coupled to the base voltage, a drain terminal coupled to the second phase output, and a gate terminal coupled to the first phase output.

9. The method of claim 8,
wherein the resonant oscillator circuit additionally comprises a first capacitance and a second capacitance, which operate in concert with the first inductor and the second inductor to produce resonant oscillations;
wherein the first capacitance includes capacitive components from a load on the first phase output and the gate terminal of the second N-type transistor; and
wherein the second capacitance includes capacitive components from a load on the second phase output and the gate terminal of the first N-type transistor.

10. A resonant oscillator circuit, comprising:
a first phase output;
a second phase output;
a first inductor;
a second inductor;
a first capacitance;
a second capacitance;
wherein the first and second inductors are configured to operate with the first and second capacitances to produce resonant oscillations which appear at the first phase output and the second phase output;
a driving circuit configured to use a first clock signal to control the first phase output, and to use a second clock signal to control the second phase output, wherein the first and second clock signals have opposite phases;
wherein the driving circuit is configured to discontinue the controlling of the first and second phase outputs after the multiple initial oscillation periods complete; and
a ramping circuit configured to ramp up an input voltage, which is used to power the resonant oscillator circuit, wherein the ramping takes place across multiple initial oscillation periods.

11. The resonant oscillator circuit of claim 10, wherein while using the first and second clock signals to control the first and second phase outputs, the driving circuit is configured to drive the first clock signal onto a first N-FET gate which clamps the output of the resonant oscillator circuit to a desired frequency, and to drive the second clock signal onto a second N-FET gate which clamps the output of the resonant oscillator circuit to the desired frequency.

12. The resonant oscillator circuit of claim 10, wherein the driving circuit includes a programmable microcontroller.

13. The resonant oscillator circuit of claim 10, wherein the ramping circuit includes an RC filter to facilitate ramping up the input voltage at a controlled rate.

14. The resonant oscillator circuit of claim 10,
wherein during an oscillator-shut-down operation, the ramping circuit is configured to ramp down the input voltage; and
wherein after the input voltage has been ramped down for a period of time, the driving circuit is configured to clamp the first and second phase outputs to a fixed voltage.

15. The resonant oscillator circuit of claim 14, wherein while ramping down the input voltage, the ramping circuit is configured to:
disconnect a power source from the input voltage; and
drain charge from a capacitor having a first terminal coupled to the input voltage and a second terminal coupled to a base voltage, wherein draining the charge involves coupling the first terminal of the capacitor to the base voltage through a resistor.

16. The resonant oscillator circuit of claim 10,
wherein the first inductor includes a first terminal coupled to the input voltage and a second terminal coupled to the first phase output;
wherein the second inductor includes a first terminal coupled to the input voltage and a second terminal coupled to the second phase output;
wherein the resonant oscillator circuit also includes a first N-type transistor with a source terminal coupled to a base voltage, a drain terminal coupled to the first phase output, and a gate terminal coupled to the second phase output;
wherein the resonant oscillator circuit additionally includes a second N-type transistor with a source terminal coupled to the base voltage, a drain terminal coupled to the second phase output, and a gate terminal coupled to the first phase output;
wherein the first capacitance includes capacitive components from a load on the first phase output and the gate terminal of the second N-type transistor; and
wherein the second capacitance includes capacitive components from a load on the second phase output and the gate terminal of the first N-type transistor.

17. The resonant oscillator circuit of claim 10,
wherein the first phase output is coupled to a first bootstrapping circuit which adds one or more voltage offsets to the first phase output to produce one or more boosted first phase outputs; and
wherein the second phase output is coupled to a second bootstrapping circuit which adds one or more voltage offsets to the second phase output to produce one or more boosted second phase outputs.

18. A resonant oscillator circuit, comprising:
a resonant oscillator with a first phase output and a second phase output, which produce clock signals with substantially opposite clock phases; and
a start up circuit for the resonant oscillator which includes,
a ramping circuit configured to ramp up an input voltage, which is used to power the resonant oscillator circuit, wherein the ramping takes place across multiple initial oscillation periods; and
a driving circuit, wherein during the multiple initial oscillation periods, the driving circuit is configured to use a first clock signal to control the first phase output, and a second clock signal to control the second phase output, wherein the first and second clock signals have opposite phases;
wherein the driving circuit is configured to discontinue the controlling of the first and second phase outputs after the multiple initial oscillation periods complete.

19. The resonant oscillator circuit of claim 18, wherein while using the first and second clock signals to control the first and second phase outputs, the driving circuit is configured to drive the first clock signal onto a first N-FET gate which clamps the output of the resonant oscillator circuit to a desired frequency, and to drive the second clock signal onto a second N-FET gate which clamps the output of the resonant oscillator circuit to the desired frequency.

20. The resonant oscillator circuit of claim 18,
 wherein during an oscillator-shut-down operation, the ramping circuit is configured to ramp down the input voltage; and
 wherein after the input voltage has been ramped down, the driving circuit is configured to clamp the first and second phase outputs to a fixed voltage.

21. The resonant oscillator circuit of claim 20, wherein while ramping down the input voltage, the ramping circuit is configured to:
 disconnect a power source from the input voltage; and
 drain charge from a capacitor having a first terminal coupled to the input voltage and a second terminal coupled to a base voltage, wherein draining the charge involves coupling the first terminal of the capacitor to the base voltage through a resistor.

22. The resonant oscillator circuit of claim 18, wherein the resonant oscillator circuit further comprises:
 a first inductor;
 a second inductor;
 a first capacitance; and
 a second capacitance;
 wherein the first and second inductors are configured to operate with the first and second capacitances to produce resonant oscillations which appear at the first phase output and the second phase output.

\* \* \* \* \*